United States Patent
Yoo et al.

(10) Patent No.: US 6,668,094 B1
(45) Date of Patent: Dec. 23, 2003

(54) VARIABLE LENGTH CODING METHOD AND APPARATUS

(75) Inventors: Kook-yeol Yoo, Suwon (KR); Byung-sun Choi, Suwon (KR); Yung-lyul Lee, Suwon (KR)

(73) Assignee: Samsung Electronics Co., Ltd., Kyungki-Do (KR)

( * ) Notice: Subject to any disclaimer, the term of this patent is extended or adjusted under 35 U.S.C. 154(b) by 665 days.

(21) Appl. No.: 09/631,883

(22) Filed: Aug. 2, 2000

(30) Foreign Application Priority Data

Aug. 2, 1999 (KR) .............................. 99-31672

(51) Int. Cl.⁷ .................. G06K 9/36; H03M 7/40; H03M 7/00
(52) U.S. Cl. .................. 382/246; 341/67; 341/107
(58) Field of Search ................... 382/232, 233, 382/236, 244, 245, 246, 247; 341/59, 63, 65, 67, 107; 375/240.23; 358/426.01, 426.16, 426.13; 348/400.1–421.1

(56) References Cited

U.S. PATENT DOCUMENTS

| | | | | |
|---|---|---|---|---|
| 4,626,829 A | * | 12/1986 | Hauck | 341/63 |
| 5,488,616 A | * | 1/1996 | Takishima et al. | 714/746 |
| 5,541,595 A | | 7/1996 | Meyer | |
| 5,793,896 A | * | 8/1998 | Golin | 382/246 |
| 5,815,217 A | * | 9/1998 | Kumazawa et al. | 348/700 |
| 5,852,469 A | * | 12/1998 | Nagai et al. | 375/240.23 |
| 5,926,574 A | * | 7/1999 | Nishikawa et al. | 382/239 |
| 5,982,306 A | * | 11/1999 | Nam | 341/67 |
| 5,999,111 A | * | 12/1999 | Park et al. | 341/67 |
| 6,404,933 B1 | * | 6/2002 | Yamamoto | 382/251 |
| 6,449,394 B1 | * | 9/2002 | Florencio | 382/246 |

FOREIGN PATENT DOCUMENTS

| | | |
|---|---|---|
| EP | 0 426 429 A2 | 5/1991 |
| EP | 0 490 537 A2 | 6/1992 |
| EP | 0 616 471 A2 | 9/1994 |

* cited by examiner

*Primary Examiner*—Andrew W. Johns
*Assistant Examiner*—Amir Alavi
(74) *Attorney, Agent, or Firm*—Sughrue Mion, PLLC

(57) ABSTRACT

A variable length coding method and apparatus is provided. The variable length coding method includes the steps of analyzing the occurrence statistics of symbols with respect to previous frames, generating a mapping table for variably mapping input symbols to bit patterns based on the analyzed occurrence statistics of the input symbols, resetting the mapping relationship between symbols and bit patterns based on the generated mapping table, and variable length coding a current frame based on the reset mapping relationship. The variable length coding method efficiently reduces the number of bits generated by dynamically varying the mapping between input symbols and bit patterns depending on the occurrence statistics of the input symbols. Moreover, the variable length coding method performs variable length coding taking into account the occurrence statistics of symbols with respect to an image frame, thereby steadily performing the variable length coding regardless of changes in the statistical characteristics or coding parameters of an image.

23 Claims, 6 Drawing Sheets

VARIABLE LENGTH CODING METHOD AND APPARATUS

BACKGROUND OF THE INVENTION

1. Field of the Invention

The present invention relates to a variable length coding method, and more particularly, to a variable length coding method for reducing the number of bits generated by dynamically varying the mapping between symbols and bit patterns depending on the occurrence statistics of symbols of an input image. The present invention also relates to a variable length coding apparatus for performing the variable length coding method. The present invention also relates to a variable length decoding method for decoding a bit pattern which has been coded by the variable length coding method. The present invention also relates to a variable length decoding apparatus for performing the variable length decoding method. The present invention is based on Korean Application No. 99-31672 which is incorporated herein by reference.

2. Description of the Related Art

Standardized video CODECs adopt a variable length coding (VLC) technique to obtain high coding efficiency. FIG. 1 shows a block diagram of a conventional variable length coding apparatus. Referring to FIG. 1, a VLC unit 10 receives a symbol and performs variable length coding based on a VLC table 12. In the VLC table 12, each symbol is mapped onto a bit pattern of a different length based on average symbol statistics of usual test patterns.

However, the symbol statistics vary considerably depending on a video sequence and coding parameters. Accordingly, in a conventional variable length coding technology, it sometimes happens that a large number of bits is allocated to a symbol even if the symbol appears frequently. This causes a problem of decreasing the efficiency of compression of bits by variable length coding.

To solve this problem, a conventional method prepares a plurality of VLC tables and selectively uses one among the prepared VLC tables. However, this method is disadvantageous in that it is difficult to sort a sequence characteristic and in that the efficiency of bit compression may be decreased because the characteristics of occurrence probabilities of symbols vary with coding parameters even with respect to the same sequence.

SUMMARY OF THE INVENTION

To solve the above problem, an object of the present invention is to provide a variable length coding method capable of efficiently reducing a bit rate by taking into account the occurrence statistics of symbols in an input image.

Another object of the present invention is to provide a variable length coding apparatus for performing this method.

Yet another object of the present invention is to provide a variable length decoding method for decoding a bit pattern which has been coded by the variable length coding method.

A further object of the present invention is to provide a variable length decoding apparatus for performing the variable length decoding.

To achieve one of the above objects of the invention, there is provided a method of variable length coding input symbols to generate bit patterns. The method includes the steps of (a) analyzing the occurrence statistics of symbols with respect to previous frames, (b) resetting a mapping relationship based on the analyzed occurrence statistics of symbols, and (c) variable length coding a current frame based on the reset mapping relationship.

It is preferable that the step (a) includes the step of calculating the occurrence statistics $P_i$ of an i-th symbol $a_i$ in N of symbols using W previous frames in accordance with $$P_i = \frac{\sum_{t=n-1}^{n-W} c_i(t)}{\sum_{j=0}^{N-1} \sum_{t=n-1}^{n-W} c_j(t)}$$

where i is a predetermined positive number indicating a symbol number, $c_i(t)$ is the number of occurrences of the symbol $a_i$ in a t-th frame, and W is a predetermined positive integer indicating the number of frames used for analyzing the occurrence statistics of symbols.

Preferably, the step (a) analyzes the occurrence statistics of symbols using only symbols that are obtained from a frame immediately before the current frame.

Alternatively, the step (a) may analyze the occurrence statistics of symbols using symbols that are obtained from all the previous frames.

It is preferable that the step (b) includes the steps of reordering the symbols $a_i$ based on the occurrence statistics $P_i$ of the symbols $a_i$, such that $P_{i'} \geq P_{i'+1}$ if $i' \leq i'+1$, where $i'$ is a new number of a symbol $a_i$, and resetting the mapping relationship such that $m(i)=i'$ based on the reordered relationship.

The variable length coding method further includes the step (c-1) for detecting whether the scene of each of the previous frames is similar to the scene of the current frame before the step (c). The current frame is variable length coded using a default variable length coding table and the mapping relationship when it is determined that the scene of a previous frame is not similar to the scene of the current frame in the step (c-1). The step (c) is performed when it is determined that the scene of a previous frame is similar to the scene of the current frame in the step (c-1).

The step (c-1) preferably includes the steps of (d-1) checking to find whether the ratio of occurrences of an intra macroblock in a frame immediately before the current frame is equal to or greater than a predetermined threshold, and (d-2) determining that the scene is changed if the ratio of occurrences of an intra macroblock in a frame immediately before the current frame is equal to or greater than the predetermined threshold, and, if not, determining that the scene is not changed.

Alternatively, the step (c-1) may include the steps of (e-1) checking to find whether the difference between the number of bits, which are generated by performing the mapping between a symbol and a bit pattern in a current image frame according to the method described above, and the number of bits, which are generated by using a default variable length coding definition, is equal to or greater than a predetermined number of bits; and (e-2) determining that the scene is changed if the difference is equal to or greater than the predetermined number of bits in the step (e-1) and, if not, determining that the scene is not changed.

Alternatively, the step (c-1) may include the steps of (f-1) measuring the sum of absolute difference (SAD) between a current image frame and a motion compensated image frame; and (f-2) determining that the scene is changed if the SAD is equal to or greater than a predetermined value in the step (f-1), and, otherwise, determining that the scene is not changed.

To achieve one of the above objects of the invention, there is provided an apparatus of variable length coding input symbols to generate bit patterns. The apparatus includes a statistical analyzer for analyzing the occurrence statistics of the input symbols with respect to previous frames, a mapping relationship resetter for resetting a mapping relationship based on the analyzed occurrence statistics of the symbols, and a variable length coding unit for variable length coding a current frame based on the reset mapping relationship.

To achieve one of the above objects of the invention, there is provided a digital image coding method to which variable length coding for generating bit patterns by variable length coding input symbols is applied. The method includes the steps of (a) analyzing the occurrence statistics of symbols with respect to previous frames, (b) resetting a mapping relationship based on the analyzed occurrence statistics of symbols, and (c) variable length coding a current frame based on the reset mapping relationship.

To achieve one of the above objects of the invention, there is provided a method of variable length decoding input bit patterns which have been variable length coded. The method includes the steps of (a) variable length decoding the input bit patterns using a default variable length coding table to obtain decoded symbols, (b) analyzing the occurrence statistics of the decoded symbols with respect to previous frames of a current frame, (c) resetting a mapping relationship based on the analyzed occurrence statistics of the input symbols, and (d) replacing the decoded symbols with symbols corresponding to the reset mapping relationship in the current frame.

To achieve one of the above objects of the invention, there is provided an apparatus for variable length decoding input bit patterns which have been variable length coded. The apparatus includes a variable length decoder for variable length decoding the input bit patterns using a default variable length coding table to obtain decoded symbols, a statistical analyzer for analyzing the occurrence statistics of the decoded symbols with respect to previous frames of a current frame, a mapping relationship resetter for resetting a mapping relationship between symbols and bit patterns based on the analyzed occurrence statistics of the input symbols, and a symbol replacer for replacing the decoded symbols with symbols corresponding to the reset mapping relationship in the current frame.

To achieve one of the above objects of the invention, there is provided a digital image decoding apparatus using variable length decoding. The apparatus includes a variable length decoding unit including a variable length decoder for variable length decoding the input bit patterns using a default variable length coding table to obtain decoded symbols, a statistical analyzer for analyzing the occurrence statistics of the decoded symbols with respect to previous frames of a current frame, a mapping relationship resetter for resetting a mapping relationship between symbols and bit patterns based on the analyzed occurrence statistics of the input symbols, and a symbol replacer for replacing the decoded symbols with symbols corresponding to the reset mapping relationship in the current frame.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE INVENTION

Figure 1:
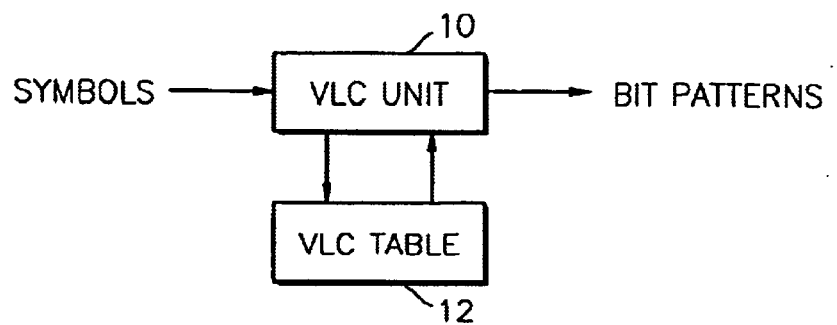
FIG. 1 is a block diagram of a conventional variable length coding apparatus.
Figure 2:
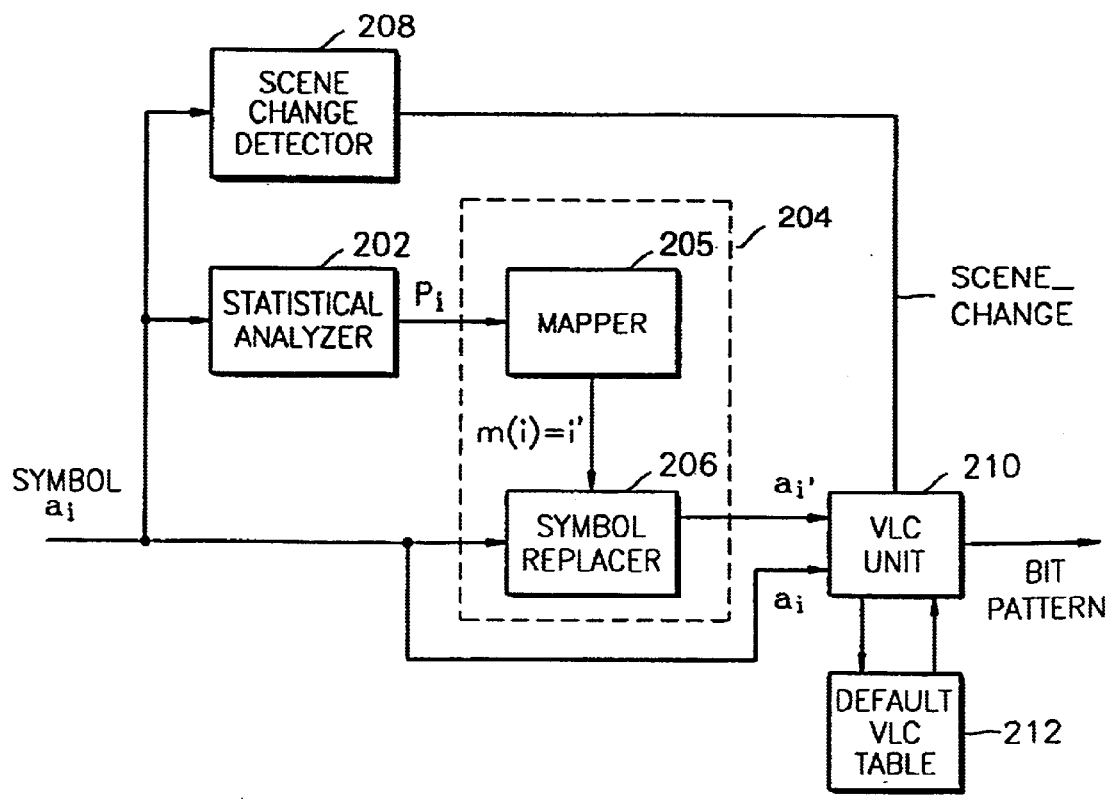
FIG. 2 is a block diagram of a variable length coding apparatus according to an embodiment of the present invention.

Hereinafter, embodiments of the present invention will be described in detail with reference to the attached drawings. Referring to FIG. 2, a variable length coding apparatus according to the present invention includes a statistical analyzer 202, a mapping relationship resetting unit 204, a scene change detector 208 and a variable length coding (VLC) unit 210. The mapping relationship resetting unit 204 includes a mapper 205 and a symbol replacer 206.

Figure 3A:
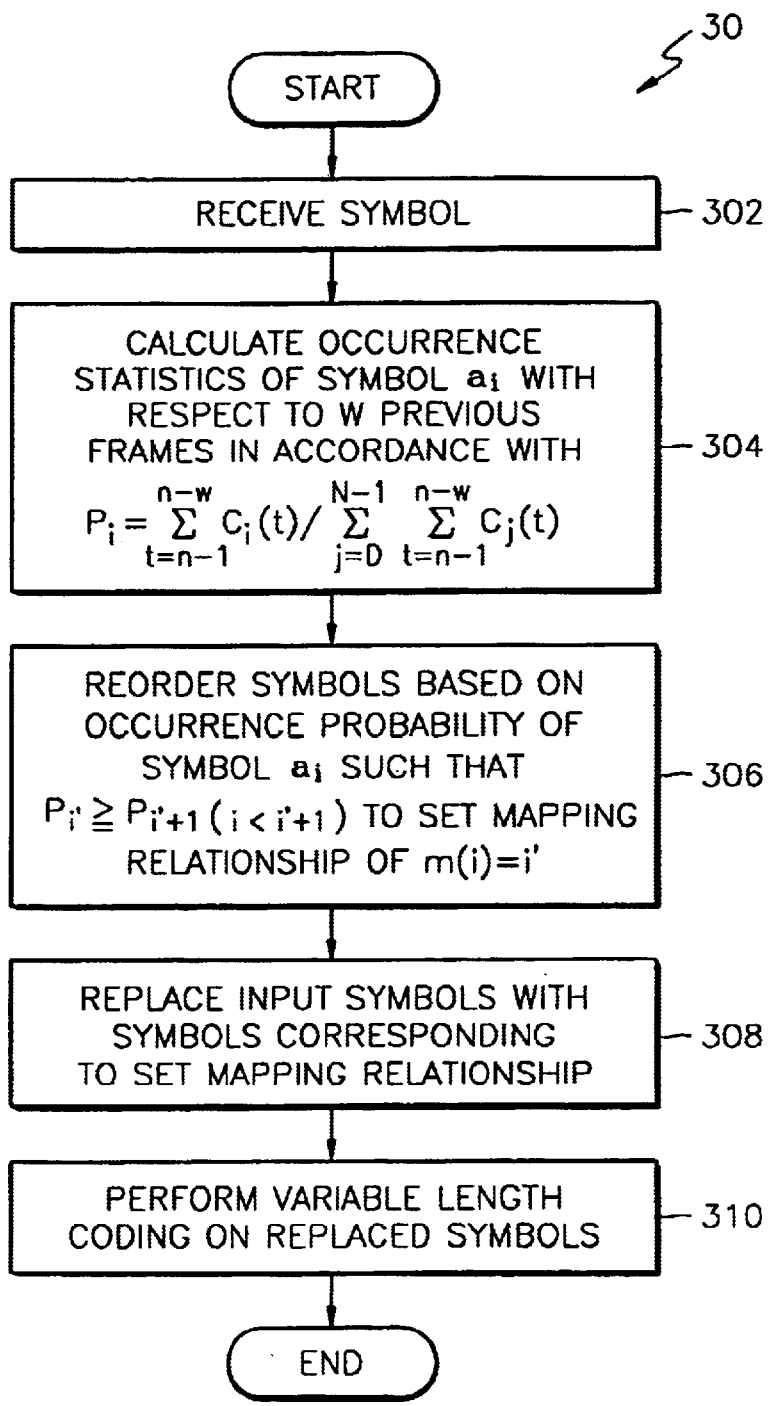
FIGS. 3A and 3B are flowcharts showing the main steps of a variable length coding method according to an embodiment of the present invention.

In the operation of such apparatus, when representing a symbol number by i, a predetermined positive number, the statistical analyzer 202 receives a symbol in step 302 (FIG. 3A) and calculates the occurrence statistics of the input symbol $a_i$ with respect to previous frames in step 304. When representing the number of occurrences of the symbol $a_i$ in a t-th frame by $c_i(t)$ and representing a predetermined positive integer indicating a window size such as the number of frames, which is used for the calculation of the occurrence statistics of symbols, by W, the statistical analyzer 202 calculates the occurrence statistics $P_i$ of each symbol $a_i$ in W previous frames in accordance with $$P_i = \frac{\sum_{t=n-1}^{n-W} c_i(t)}{\sum_{j=0}^{N-1} \sum_{t=n-1}^{n-W} c_j(t)}$$

Thus, the occurrence statistics $P_i$ of an i-th symbol among N kinds of symbols in W previous frames are obtained. In the above embodiment, the occurrence statistics of each symbol are calculated based on symbols which are obtained from a plurality of previous image frames, but the present invention is not restricted thereto. The occurrence statistics of each symbol may be calculated based on only symbols which are obtained from the previous image, or based on symbols which are obtained from all previous images.

Next, the mapper 205 reorders the symbols based on the occurrence probability $P_i$ of each symbol $a_i$, which is output from the statistical analyzer 202 and sets a mapping relationship of $$m(i)=i'$$

based on the reordered relationship in step 306. In an embodiment of the present invention, the symbols are reordered such that $P_{i'} \geq P_{i'+1}$, when $i' < i'+1$, that is, the occurrence probability of each symbol $a_i$ decreases. Therefore, a symbol having the largest occurrence probability is assigned a bit pattern having the least number of bits in a VLC table, and as the occurrence probability of a symbol decreases, the symbol is assigned a bit pattern having more bits. With such an arrangement, the mapping relationship is reset. Thereafter, the symbol replacer 206 replaces the input symbols with symbols corresponding to s the set mapping relationship $m(i)=i'$) in step 308.

Meanwhile, in a variable length coding method according to the present invention, occurrence probabilities obtained with respect to previous image frames cannot be used for a current image frame when the previous frames and the current frame are not correlated. In other words, it is necessary to detect whether the current image frame is similar to the previous image frames. Accordingly, the scene change detector 208 compares a current frame scene with previous frame scenes and detects whether they are similar, in step 320. In an embodiment of the present invention, the scene change detector 208 outputs a control signal SCENE_CHANGE as a logic "low" level when a current frame scene is similar to a previous frame scene, and outputs a control signal SCENE_CHANGE as a logic "high" level when a current frame scene is not similar to a previous frame scene.

During the detection of scene change, it is preferable to determine that a scene is changed when the ratio of occurrences of an intra macroblock in the previous image frame is equal to or more than a predetermined threshold. Alternatively, it is possible to determine that a scene is changed when the difference between the number of bits, which are generated by performing the mapping between a symbol and a bit pattern in a current image frame according to the method described above, and the number of bits, which are generated by using a default variable length coding definition, is equal to or more than a predetermined number of bits. Alternatively, it is possible to determine that a scene is changed when the sum of absolute difference (SAD) between a current image frame and a motion compensated image frame is equal to or more than a predetermined value.

Then, when a "low" level control signal SCENE_CHANGE is input from the scene change detector 208, this indicates that a scene has not changed, and thus, in step 30, the VLC unit 210 performs variable length coding on the replaced symbols, that is, symbols $a_i$ obtained based on the reset mapping relationship, using the default VLC table 212 for the current frame. On the other hand, when a "high" level control signal SCENE_CHANGE is input from the scene change detector 208, this indicates that a scene has changed, and thus, in step 322, the VLC unit 210 performs variable length coding on the input symbols $a_i$ using the default VLC table 212 and mapping relationship for the current frame, instead of performing variable length coding on the current frame based on the reset mapping relationship.

After performing variable length coding with respect to the current frame, it is determined whether the current frame is the last frame in step 324. When it is determined that the current frame is not the last one in step 324, the next frame is selected in step 326, and the steps 302 through 324 are repeated.

For a clearer understanding of the present invention, the operation of an apparatus according to the present invention will be described with a simple example. First, it is assumed that variable length coding is performed using a VLC table such as Table 1.

TABLE 1

| Symbols | Bit patterns | Number of bits |
|---------|--------------|----------------|
| $a_0$   | 1            | 1              |
| $a_1$   | 01           | 2              |
| $a_2$   | 001          | 3              |
| $a_3$   | 0001         | 4              |

In addition, it is assumed that the occurrence probabilities of symbols obtained after coding an arbitrary image frame are as follows.

TABLE 2

| Symbols | Occurrence probabilities |
|---------|--------------------------|
| $a_0$   | 0.2                      |
| $a_1$   | 0.3                      |
| $a_2$   | 0.1                      |
| $a_3$   | 0.4                      |

According to a variable length coding method of the present invention, the mapping table between symbols and bit patterns is generated depending on probabilities.

TABLE 3

| Symbol ($a_i$) | Bit pattern | Mapping table i' | $m(i) = i'$ |
|----------------|-------------|------------------|-------------|
| $a_3$          | 1           | 0                | $m(3) = 0$  |
| $a_1$          | 01          | 1                | $m(1) = 1$  |
| $a_0$          | 001         | 2                | $m(0) = 2$  |
| $a_2$          | 0001        | 3                | $m(2) = 3$  |

For example, a symbol $a_2$, whose occurrence probability is smallest, is mapped to a bit pattern of four bits, i.e., 0001. A symbol $a_3$, whose occurrence probability is largest, is mapped to a bit pattern of a single bit, i.e., 1.

An average bit rate per symbol, for symbols that are variable length coded based on the mapping table shown in Table 3, is $\Sigma P_i S_i = 0.2 \times 1 + 0.3 \times 2 + 0.1 \times 3 + 0.4 \times 4 = 2.7$ bits/symbol. On the other hand, the average bit rate per symbol, for symbols that are variable length coded according to the present invention, is $\Sigma P_i S_{m(i)} = 0.2 \times 3 + 0.3 \times 2 + 0.1 \times 4 + 0.4 \times 1 = 2.0$ bits/symbol. Accordingly, the present invention reduces the number of generated bits by 0.7 bits/symbol.

In other words, the present invention reduces the number of generated bits, even while using a VLC table which is used in variable length coding. In addition, according to a variable length coding method of the present invention, variable length coding is stably performed regardless of changes in the statistical characteristics or coding parameters of an image, since the variable length coding is performed considering the statistical characteristics of symbols of an image frame.

Simulations were performed to estimate the performance of a variable length coding method of the present invention. Five kinds of test sequence, which have a QCIF frame format of 176×144 pixels and are composed of 100 frames, were used in the simulations. A fixed quantization step size was used.

As the results of the simulations, FIGS. 4A through 4E show graphs for comparing a variable length coding method of the present invention and a conventional variable length coding method based on the number of bits per frame during coding. FIGS. 4A through 4E show the variation of bits per frame with respect to quantization step size when "News", "Silent", "Container ship", "Foreman" and "Hall Objects", each of which has a QCIF frame format of 176×144 pixels and is composed of 100 frames, were used as test sequences. For other test conditions, common test conditions defined in H.26L were used.

Referring to FIGS. 4A through 4D, as the quantization step size becomes smaller, a very large performance gain is achieved in a variable length coding method of the present invention compared to a variable length coding method according to the Telenor H.26L proposal.

According to the present invention, to improve variable length coding efficiency, a mapping relationship between symbols and bit patterns is adaptively changed in a variable length codeword table based on the results of partially measuring symbol probabilities, without changing a VLC table. According to the results of a simulation in which a method of the present invention was applied to macroblock (MB) mode information, the reduction of MB mode bit rate was about 50%.

As described above, according to a variable length coding method of the present invention, the number of bits to be generated can be reduced by dynamically varying a mapping relationship. A variable length coding method of the present invention can be applied to H.261, H.263, MPEG-1, MPEG-2 and MPEG-4, which use variable length coding, and to H.26L proposals which uses universal variable length coding (UVLC).

Figure 5:
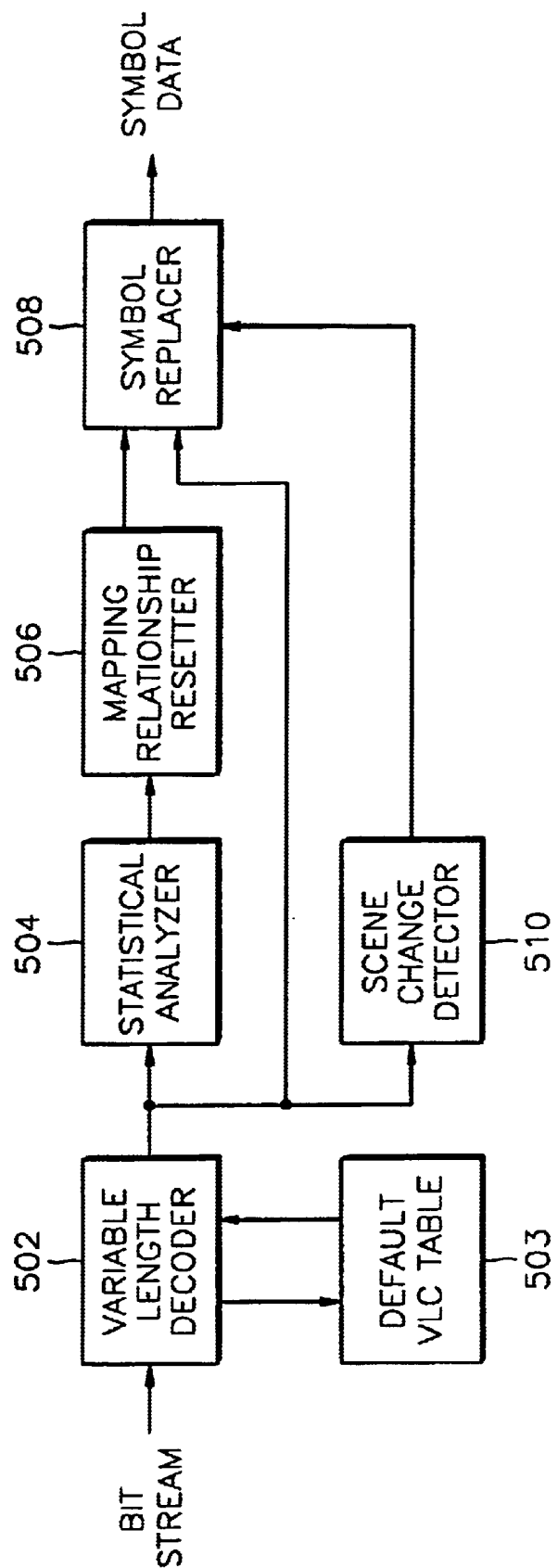
FIG. 5 is a block diagram of a variable length decoding apparatus according to an embodiment of the present invention.

Bit patterns, which have been variable length coded by a variable length coding method according to the present invention, are transmitted to a transmission channel. The transmitted bit patterns can be decoded by a variable length decoder according to an embodiment of the present invention. FIG. 5 is a block diagram of a variable length decoding apparatus according to an embodiment of the present invention. Referring to FIG. 5, the variable length decoding apparatus includes a variable length decoder 502, a statistical analyzer 504, a mapping relationship resetter 506, a symbol replacer 508 and a scene change detector 510.

Figure 3B:
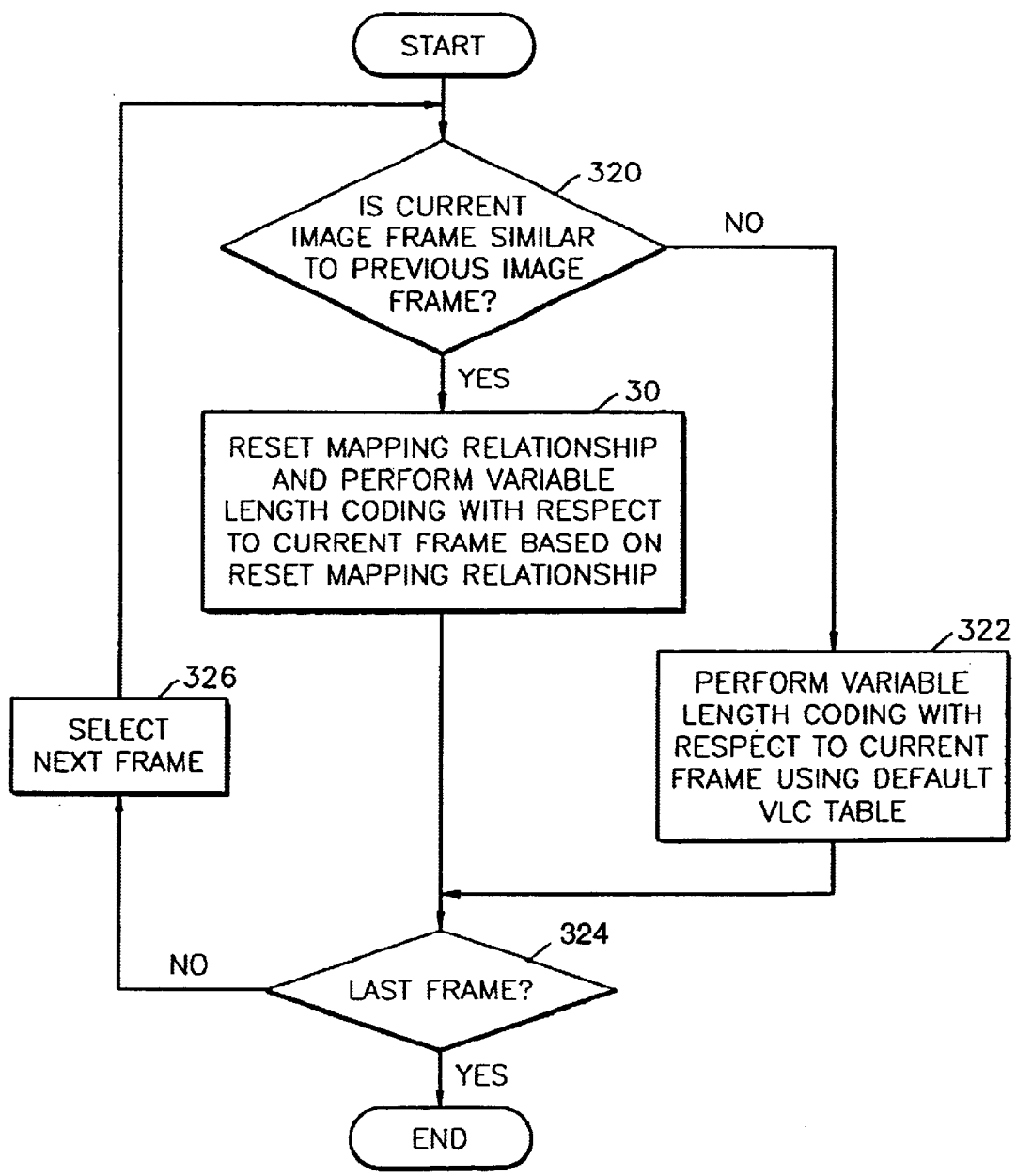
Figure 4A:
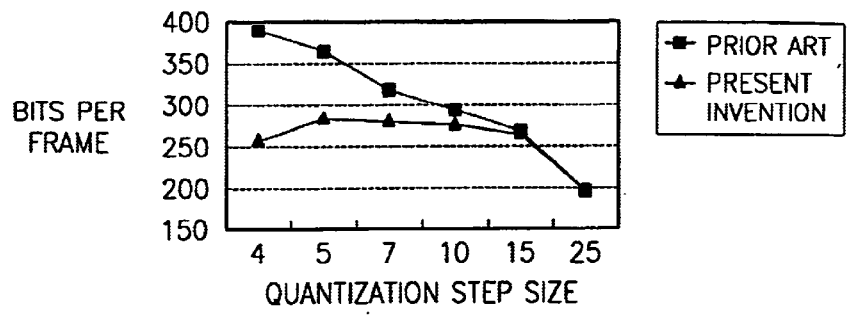
FIGS. 4A through 4E are graphs for comparing a variable length coding method of the present invention and a conventional variable length coding method based on the number of bits per frame during coding.
Figure 4B:
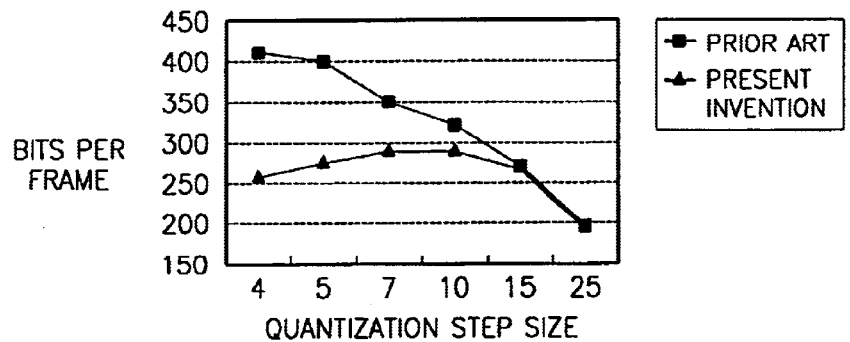
Figure 4C:
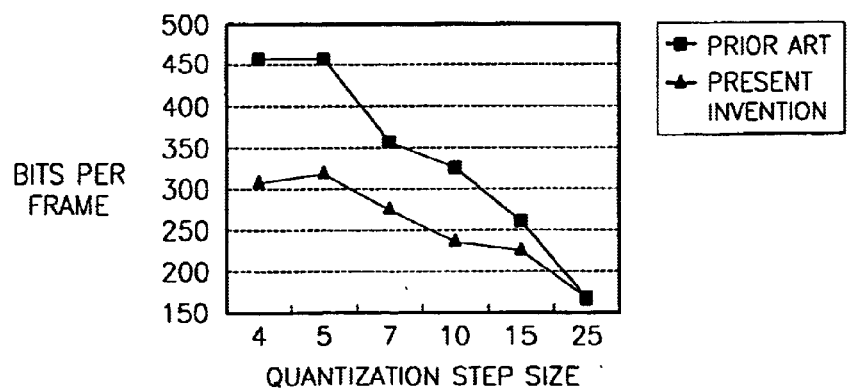
Figure 4D:
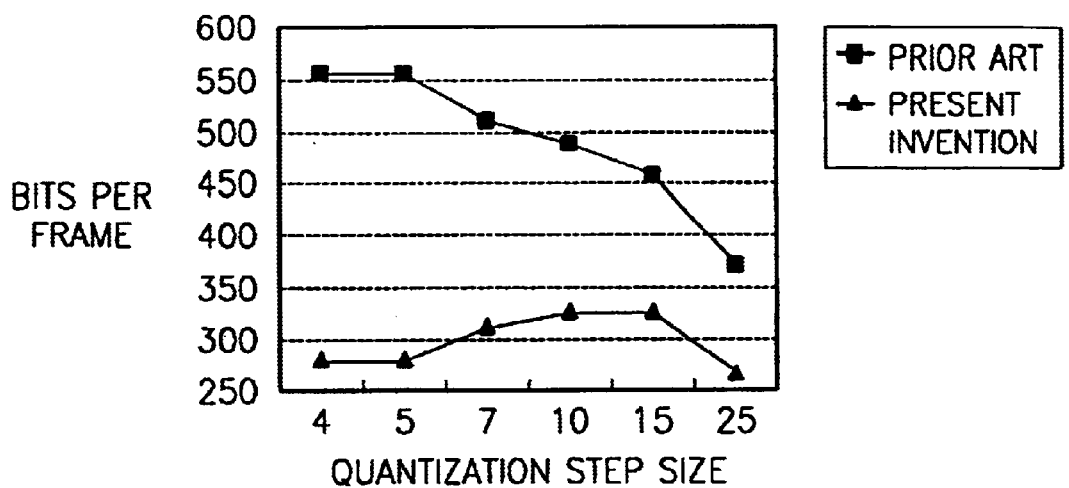
Figure 4E:
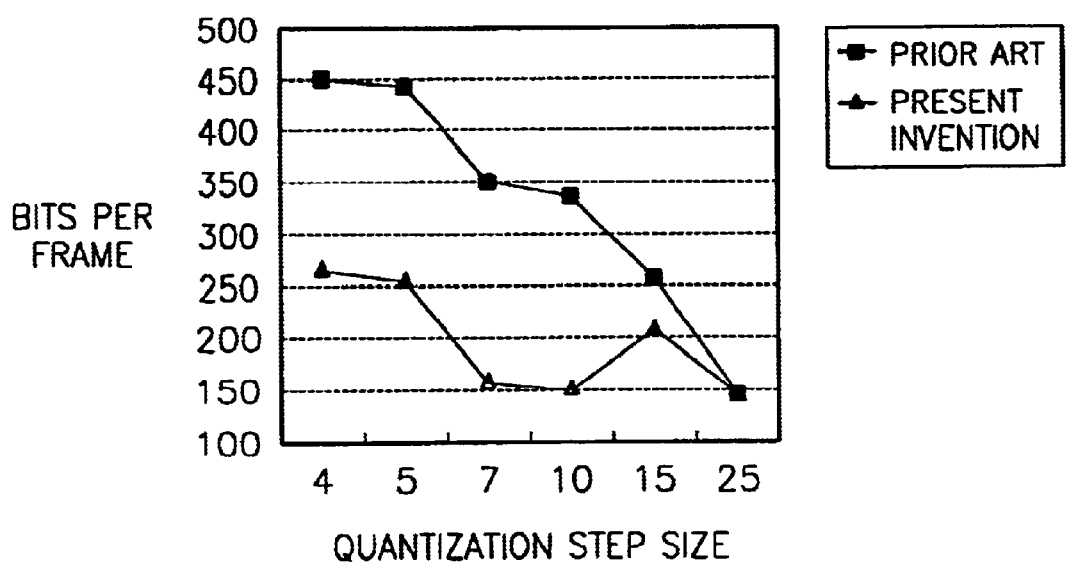

In the operation of the apparatus, the variable length decoder 502 performs variable length decoding on bit patterns in an input bit stream using a default VLC table 503 and outputs decoded symbols. The statistical analyzer 504 analyzes the occurrence statistics of the decoded symbols with respect to previous frames. The mapping relationship resetter 506 resets the mapping relationship between input symbols and bit patterns based on the analyzed occurrence statistics. Since the reset mapping relationship is determined based on the occurrence statistics of symbols, the reset mapping relationship is the same as that used during coding, which is performed by a variable length coding method according to an embodiment of the present invention as described with reference to FIGS. 2, 3A and 3B, if errors in the input bit patterns are not large. In other words, even if an encoding apparatus, which has encoded an image using a variable length coding method of the present invention, does not transmit information on the mapping relationship to a decoding apparatus, the decoding apparatus can obtain the mapping relationship used during the encoding by decoding a bit stream transmitted from the encoding apparatus. Then, the symbol replacer 508 replaces the decoded symbols with symbols corresponding to the reset mapping relationship in a current frame and outputs symbol data. Finally, the bit patterns, which have been coded by a variable length coding method according to the present invention, which dynamically varies a mapping relationship to reduce the number of bits that are generated, are successfully variable length decoded.

In the above embodiment of the present invention, the reset mapping relationship is applied to all the bit patterns during the variable length decoding. In another case, the variable length decoding apparatus according to the above embodiment of the present invention may also include a scene change detector 510 in order to decode bit patterns which have been coded by a variable length coding apparatus, which includes the scene change detector 208 as described with reference to FIG. 2. The scene change detector 510 compares a previous frame scene and a current frame scene using the decoded symbols which are output from the variable length decoder 502 to detect whether they are similar. Then, the scene change detector 510 outputs a "low" control signal when they are not similar and a "high" control signal when they are similar. In response to the "low" control signal, the symbol replacer 508 does not perform symbol replacement and outputs the decoded symbols received from the variable length decoder 502 as symbol data. Alternatively, in response to the "high" control signal, the symbol replacer 508 replaces the decoded symbols received from the variable length decoder 502 with symbols corresponding to the reset mapping relationship and outputs the replaced symbols as symbol data.

Such variable length coding apparatus may be included in a digital image decoding apparatus using variable length decoding.

Variable length coding and decoding methods according to the present invention can be made into programs which can be executed in a computer. The programs may be stored in a magnetic recoding medium such as a floppy disc or a hard disc or an optical recording medium such as CD-ROM or DVD, or may be transmitted through a carrier wave medium such as the Internet. Moreover, program codes and code segments constructing the programs can be easily inferred by computer programmers in the art.

As described above, a variable length coding method according to the present invention dynamically varies the mapping relationship between input symbols and bit patterns based on the characteristics of an image, thereby reducing the amount of bits to be generated.

What is claimed is:

1. A method of variable length coding input symbols to generate bit patterns, the method comprising the steps of:
   (a) analyzing the occurrence statistics of symbols with respect to previous frames;
   (b) resetting a mapping relationship based on the analyzed occurrence statistics of symbols; and
   (c) variable length coding a current frame based on the reset mapping relationship.

2. The method of claim 1, wherein the step (a) comprises the step of calculating the occurrence statistics $P_i$ of an i-th symbol $a_i$ in N of symbols using W previous frames in accordance with $$P_i = \frac{\sum\limits_{t=n-1}^{n-W} c_i(t)}{\sum\limits_{j=0}^{N-1} \sum\limits_{t=n-1}^{n-W} c_j(t)}$$

where i is a predetermined positive number indicating a symbol number, $c_i(t)$ is the number of occurrences of the symbol $a_i$ in a t-th frame, and W is a predetermined positive integer indicating the number of frames used for analyzing the occurrence statistics of symbols.

3. The method of claim 1, wherein the step (a) analyzes the occurrence statistics of symbols using only symbols that are obtained from a frame immediately before the current frame.

4. The method of claim 1, wherein the step (a) analyzes the occurrence statistics of symbols using symbols that are obtained from all the previous frames.

5. The method of claim 1, wherein the step (b) comprises the steps of:

reordering the symbols $a_i$ based on the occurrence statistics $P_i$ of the symbols $a_i$ such that $P_{i'} \geq P_{i'+1}$ if $i' \leq i'+1$, where i' is a new number of a symbol $a_j$; and resetting the mapping relationship such that $m(i)=i'$ based on the reordered relationship.

6. The method of any one of claims 1–5, before the step (c), further comprising the step (c-1) for detecting whether the scene of each of the previous frames is similar to the scene of the current frame, wherein the current frame is variable length coded using a default variable length coding table and the mapping relationship when it is determined that the scene of a previous frame is not similar to the scene of the current frame in the step (c-1), and the step (c) is performed when it is determined that the scene of a previous frame is similar to the scene of the current frame in the step (c-1).

7. The method of claim 6, wherein the step (c-1) comprises the steps of:

(d-1) checking to find whether the ratio of occurrences of an intra macroblock in a frame immediately before the current frame is equal to or greater than a predetermined threshold; and (d-2) determining that the scene is changed if the ratio of occurrences of an intra macroblock in a frame immediately before the current frame is equal to or greater than the predetermined threshold, and, if not, determining that the scene is not changed.

8. The method of claim 6, wherein the step (c-1) comprises the steps of:

(e-1) checking to find whether the difference between the number of bits, which are generated by performing the mapping between a symbol and a bit pattern in a current image frame, and the number of bits, which are generated by using a default variable length coding definition, is equal to or greater than a predetermined number of bits; and (e-2) determining that the scene is changed if the difference is equal to or greater than the predetermined number of bits in the step (e-1) and, if not, determining that the scene is not changed.

9. The method of claim 6, wherein the step (c-1) comprises the steps of:

(f-1) measuring the sum of absolute difference (SAD) between a current image frame and a motion compensated image frame; and (f-2) determining that the scene is changed if the SAD is equal to or greater than a predetermined value in the step (f-1), and, otherwise, determining that the scene is not changed.

10. An apparatus of variable length coding input symbols to generate bit patterns, the apparatus comprising:

a statistical analyzer for analyzing the occurrence statistics of the input symbols with respect to previous frames;

a mapping relationship resetter for resetting a mapping relationship based on the analyzed occurrence statistics of the symbols; and a variable length coding unit for variable length coding a current frame based on the reset mapping relationship.

11. The apparatus of claim 10, wherein the statistical analyzer calculates the occurrence statistics $P_i$ of each symbol $a_i$ in W previous frames in accordance with $$P_i = \frac{\sum_{t=n-1}^{n-W} c_i(t)}{\sum_{j=0}^{N-1} \sum_{t=n-1}^{n-W} c_j(t)}$$

where i is a predetermined positive number indicating a symbol number, $c_i(t)$ is the number of occurrences of the symbol $a_i$ in a t-th frame, and W is a predetermined positive integer indicating the number of frames used for analyzing the occurrence statistics of symbols, and outputs the occurrence statistics $P_i$ of an i-th symbol among N of symbols in W previous frames.

12. The apparatus of claim 10, wherein the statistical analyzer analyzes the occurrence statistics of symbols using only symbols that are obtained from a frame immediately before the current frame.

13. The apparatus of claim 10, wherein the statistical analyzer analyzes the occurrence statistics of symbols using symbols that are obtained from all the previous frames.

14. The apparatus of claim 10, wherein the mapping relationship resetter reorders the symbols $a_i$ based on the occurrence statistics $P_i$ of the symbols $a_i$ such that $P_{i'} \geq P_{i'+1}$ if $i' \leq i'+1$, where i' is a new number of a symbol $a_j$, and resets the mapping relationship such that $m(i)=i'$ based on the reordered relationship.

15. The apparatus of claim 10, further comprising a scene change detector for detecting whether the scene of each of the previous frames is similar to the scene of the current frame, outputting a first logic level as a control signal when the scene of each of the previous frames is not similar to the scene of the current frame, and outputting a second logic level as a control signal when the scene of each of the previous frames is similar to the scene of the current frame, wherein the variable length coding unit performs variable length coding on the current frame using a default variable length coding table and the mapping relationship, in response to the first logic level control signal, and performs variable length coding on the current frame using the reset mapping relationship, in response to the second logic level control signal.

16. The apparatus of claim 15, wherein the scene change detector comprises:

means for measuring the ratio of occurrences of an intra macroblock in a frame immediately before the current frame; and determining means for determining that the scene is changed if the ratio of occurrences of an intra macroblock is equal to or greater than a predetermined threshold, and, if not, determining that the scene is not changed.

17. The apparatus of claim 15, wherein the scene change detector comprises:

means for counting the first number of bits, which are generated by performing mapping between symbols and bit patterns with respect to the current image frame based on a default mapping table and counting the second number of bits, which are generated by performing mapping between symbols and bit patterns with respect to the current image frame based on the reset mapping relationship; and determining means for calculating a difference between the first number of bits and the second number of bits, determining that the scene is changed if the difference is equal to or greater than a predetermined value, and, if not, determining that the scene is not changed.

18. The apparatus of claim 15, wherein the scene change detector comprises:

sum of absolute difference (SAD) measuring means for measuring the SAD between the current image frame and a motion compensated image frame; and determining means for determining that the scene is changed if the SAD is equal to or greater than a predetermined value, and, otherwise, determining that the scene is not changed.

19. A digital image coding method to which variable length coding for generating bit patterns by variable length coding input symbols is applied, the method comprising the steps of:

(a) analyzing the occurrence statistics of symbols with respect to previous frames;

(b) resetting a mapping relationship based on the analyzed occurrence statistics of symbols; and (c) variable length coding a current frame based on the reset mapping relationship.

20. A method of variable length decoding input bit patterns which have been variable length coded, comprising the steps of:

(a) variable length decoding the input bit patterns using a default variable length coding table to obtain decoded symbols;

(b) analyzing the occurrence statistics of the decoded symbols with respect to previous frames of a current frame;

(c) resetting a mapping relationship based on the analyzed occurrence statistics of the input symbols; and (d) replacing the decoded symbols with symbols corresponding to the reset mapping relationship in the current frame.

21. An apparatus for variable length decoding input bit patterns which have been variable length coded, comprising:

a variable length decoder for variable length decoding the input bit patterns using a default variable length coding table to obtain decoded symbols;

a statistical analyzer for analyzing the occurrence statistics of the decoded symbols with respect to previous frames of a current frame;

a mapping relationship resetter for resetting a mapping relationship between symbols and bit patterns based on the analyzed occurrence statistics of the input symbols; and a symbol replacer for replacing the decoded symbols with symbols corresponding to the reset mapping relationship in the current frame.

22. A digital image decoding apparatus using variable length decoding, the apparatus comprising variable length decoding means comprising:

a variable length decoder for variable length decoding the input bit patterns using a default variable length coding table to obtain decoded symbols;

a statistical analyzer for analyzing the occurrence statistics of the decoded symbols with respect to previous frames of a current frame;

a mapping relationship resetter for resetting a mapping relationship between symbols and bit patterns based on the analyzed occurrence statistics of the input symbols; and a symbol replacer for replacing the decoded symbols with symbols corresponding to the reset mapping relationship in the current frame.

23. The apparatus of claim 22, further comprising a scene change detector for detecting whether the scene of each of the previous frames is similar to the scene of the current frame using the decoded symbols output from the variable length decoder, outputting a first logic level as a control signal when the scene of each of the previous frames is not similar to the scene of the current frame, and outputting a second logic level as a control signal when the scene of each of the previous frames is similar to the scene of the current frame, wherein the symbol replacer does not perform symbol replacement but outputs the decoded symbols, which are received from the variable length decoder, as symbol data, in response to the first logic level control signal, and the symbol replacer replaces the decoded symbols received from the variable length decoder with symbols corresponding to the reset mapping relationship, in response to the second logic level control signal, and outputs the replaced symbols as symbol data.

* * * * *